(12) United States Patent
Manabe et al.

(10) Patent No.: US 8,686,477 B2
(45) Date of Patent: Apr. 1, 2014

(54) GROUND CONTACT STRUCTURE FOR A LOW DARK CURRENT CMOS PIXEL CELL

(75) Inventors: Sohei Manabe, San Jose, CA (US); Jeong-Ho Lyu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/558,231

(22) Filed: Jul. 25, 2012

(65) Prior Publication Data

US 2014/0027827 A1  Jan. 30, 2014

(51) Int. Cl.
| | |
|---|---|
| H01L 27/148 | (2006.01) |
| H01L 29/768 | (2006.01) |
| H01L 31/062 | (2012.01) |
| H01L 31/113 | (2006.01) |
| H01L 27/146 | (2006.01) |

(52) U.S. Cl.
CPC .... *H01L 27/14614* (2013.01); *H01L 27/14616* (2013.01)
USPC ..... 257/215; 257/291; 257/292; 257/E27.133

(58) Field of Classification Search
CPC ................... H01L 27/14614; H01L 27/14616
USPC ............................ 257/215, 291, 292, E27.133
See application file for complete search history.

(56) References Cited

U.S. PATENT DOCUMENTS

| | | | |
|---|---|---|---|
| 2001/0023949 A1 | 9/2001 | Johnson et al. | |
| 2003/0227039 A1* | 12/2003 | Umeda et al. | 257/291 |
| 2004/0161868 A1* | 8/2004 | Hong | 438/48 |
| 2005/0116251 A1* | 6/2005 | Abe et al. | 257/146 |
| 2005/0139769 A1 | 6/2005 | Kita et al. | |
| 2008/0067565 A1* | 3/2008 | Abe et al. | 257/292 |
| 2008/0157152 A1* | 7/2008 | Shim | 257/292 |
| 2008/0254564 A1* | 10/2008 | Kimura et al. | 438/69 |
| 2009/0008684 A1* | 1/2009 | Kuroda | 257/292 |
| 2009/0050944 A1* | 2/2009 | Hong | 257/292 |
| 2009/0053848 A1* | 2/2009 | Fan | 438/59 |
| 2010/0207170 A1* | 8/2010 | Paik et al. | 257/227 |
| 2010/0271524 A1* | 10/2010 | Venezia et al. | 348/308 |
| 2011/0068429 A1* | 3/2011 | Venezia et al. | 257/443 |

FOREIGN PATENT DOCUMENTS

| | | |
|---|---|---|
| EP | 1801876 A1 | 6/2007 |
| EP | 2073270 A2 | 6/2009 |

OTHER PUBLICATIONS

EP 13172885.9—Extended European Search Report, mailed Jan. 23, 2014 (6 pages).

* cited by examiner

*Primary Examiner* — David S Blum
(74) *Attorney, Agent, or Firm* — Blakely Sokoloff Taylor & Zafman LLP

(57) ABSTRACT

Pixel array structures to provide a ground contact for a CMOS pixel cell. In an embodiment, an active area of a pixel cell includes a photodiode disposed in a first portion of an active area, where a second portion of the active area extends from a side of the first portion. The second portion includes a doped region to provide a ground contact for the active area. In another embodiment, the pixel cell includes a transistor to transfer the charge from the photodiode, where a gate of the transistor is adjacent to the second portion and overlaps the side of the first portion.

14 Claims, 11 Drawing Sheets

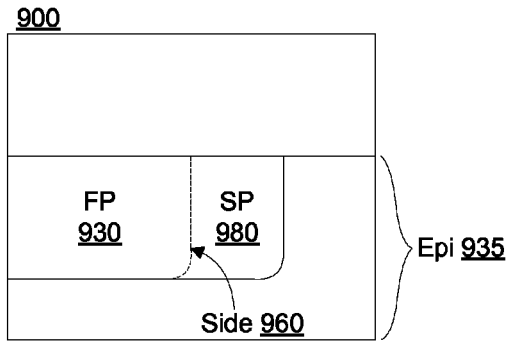
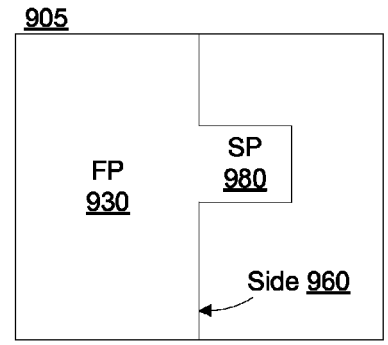
FIG. 9A        FIG. 9B
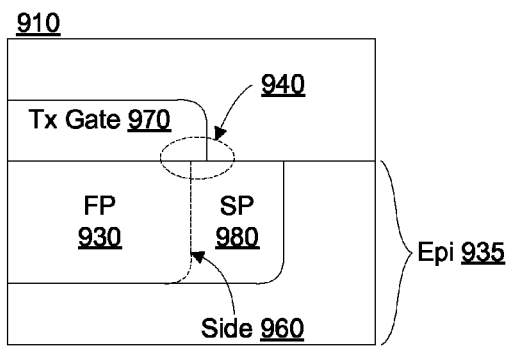
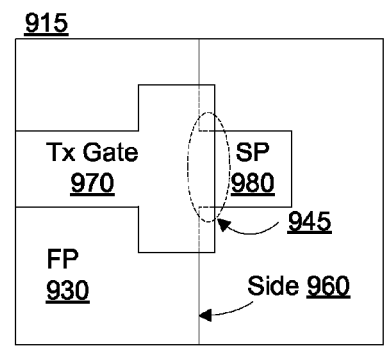
FIG. 9C        FIG. 9D
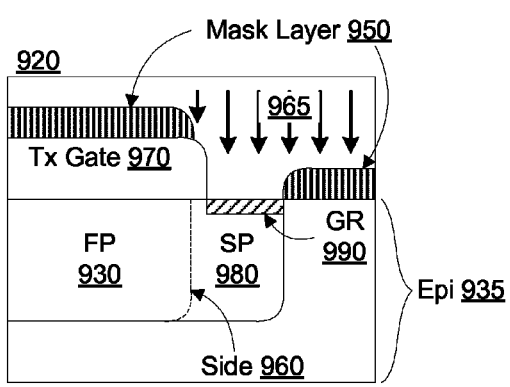
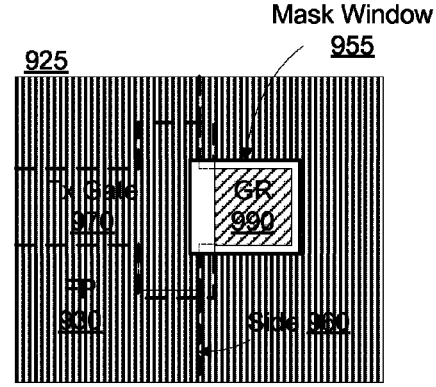
FIG. 9E        FIG. 9F

GROUND CONTACT STRUCTURE FOR A LOW DARK CURRENT CMOS PIXEL CELL

BACKGROUND

1. Technical Field

This disclosure relates generally to pixel arrays, and in particular, but not exclusively to complementary metal-oxide semiconductor ("CMOS") pixel arrays.

2. Background Art

FIG. 1 illustrates a pixel array structure, according to an existing technique, in which two neighboring CMOS image sensors (CIS) pixels 100 are formed within a p-type doped epitaxial (or "epi") layer 140 disposed over a p-type doped silicon substrate 105. When a photo-generated charge carrier is formed shallow within pixel 100 (e.g., charge carrier 150), it experiences an attractive force (shown by the arrows 145) towards a photo-sensor or photodiode ("PD") region 115, due to a depletion region or P-N junction between PD region 115 and the underlying p-type doped epi layer 140. In the illustrated embodiment, p-type doped pinning layers 135 overlay each of PD regions 115 to passivate their surfaces. CIS pixels 100 are separated by isolation structures—e.g. Shallow Trench Isolation (STI) regions 160—which are disposed within p-type doped wells 130. In each CIS pixel 100, additional pixel circuitry (not shown) is disposed adjacent to PD region 115 within a P doped well (not shown). Such pixel circuitry may commence acquisition of an image charge within PD region 115 to reset the image charge accumulated within PD region 115, to ready CIS pixel 100 for the next image, or to transfer out the image data acquired by CIS pixel 100.

When substrate 105 is made very thin, such as in the case of a Back Side Illuminated (BSI) CIS, and/or when the number of pixels is made very large, the lateral electrical resistance within substrate 105 may become relatively large and reduce performance of the pixel array. Performance limitations associated with increased substrate resistance are therefore problematic—particularly in BSI devices. For example, uniformity of dark is a common problem in image data generated with such devices. Other thin substrate devices such as those fabricated on Silicon On Insulator (SOI) substrates or those incorporating buried collector layers may also have similar problems. Today, such problems are addressed with the addition of ground contact structures within pixel substrate or p-well contacts—such as p+ doped contacts 180 within p-type doped wells 130—and with associated grounding metal layer traces coupled thereto.

For example, FIG. 2 shows elements of a typical pixel cell 200 for which grounding portion 218 provides ground contact 220 (e.g. contact 180) according to a conventional pixel array architecture. Pixel cell 200 includes photodiode PD 202, a transfer (Tx) transistor comprising Tx gate 204, a reset (RST) transistor comprising RST drain 208 and RST gate 210, and a source-follower (SF) transistor comprising SF source 212, SF gate 216 and SF drain 214. During operation of pixel cell 200, transfer gate 204 receives a transfer signal to transfer charge from PD 202 to floating diffusion node FD 206. RST drain 208 and RST gate 210 are operable to reset pixel cell 200 (e.g., to discharge or charge FD 206 and/or PD 202 to a preset voltage) under control of a reset signal provided to RST gate 210. FD 206 is coupled via a metal trace (not shown) to provide to SF gate 216 a potential for controlling a current exchange between SF source 212 and SF drain 214 which, in turn, determines image data output from pixel cell 200.

Grounding portion 218 is formed in p-well and/or isolation structures adjoining PD 202 to reduce the effects of resistance in substrate 105. However, doping to form grounding portion 218 is a source of fabrication defects. For example, grounding portion 218 is often a minimum area determined by design rules. Mask alignment for such a small area is prone to overlap with doped regions of PD 202. Accordingly, P+ implantation to form grounding portion 218 tends to result in wounded pixels—e.g. where PD 202 has defects in its depletion area. Providing a larger area for grounding portion 218 tends to be at the cost of the available area for pixel cell 200—in particular, area for PD 202. For at least these reasons, conventional techniques for providing a ground contact structure for a pixel cell are limiting on photodiode performance.

BRIEF DESCRIPTION OF THE DRAWINGS

The various embodiments of the present invention are illustrated by way of example, and not by way of limitation, in the figures of the accompanying drawings and in which:

FIGS. 9A through 9F are elevation views illustrating features of a process for fabricating a pixel cell in accordance with an embodiment.

DETAILED DESCRIPTION

Certain embodiments provide techniques for promoting conductivity for a pixel array. A semiconductor substrate for the pixel array may adjoin an epitaxial layer in which (and/or onto which) is disposed one or more pixel structures of the pixel array. The substrate may, for example, be more heavily doped than the adjoining epitaxial layer. The pixel array may include a pixel cell comprising an active area disposed within the epitaxial layer—e.g. where a side of the active area is defined at least in part by one or more adjoining isolation structures and/or well structures. An isolation region adjoining the active area may, for example, include a dielectric material such as silicon dioxide and/or any of a variety of other isolating materials for limiting electrical crosstalk.

The active area of the pixel cell may comprise a dopant well more heavily doped than other regions of the epitaxial layer. In an embodiment, a first portion of the active area includes a photodiode to accumulate a charge, where a transistor of the pixel cell is to transfer the charge from the photodiode. The transistor may comprise a polysilicon gate disposed over the active area. The active area may further include a second portion extending from a side of the first portion, the second portion including a doped region to provide a ground contact for the active area. The gate of the transfer transistor may be adjacent to the second portion and overlap the side of the first portion.

In an embodiment, a portion of the doped region is self-aligned with the transfer gate polysilicon. A portion of the transfer gate may include one or more lobes to further reduce the possibility of defects in the photodiode depletion area which might otherwise be a result of fabrication of the doped region. Such lobes may, for example, form an "L shape" structure or a "hammerhead shape" structure at a portion of the transfer gate which overlaps the side of the first portion. Such structures may, for example, protect implantation—e.g. P+ implantation—for formation of the doped region from extending into the photodiode of the first portion. To achieve large photodiode area, at least a portion of the transfer gate may have a width which is comparatively narrow with respect to other portions of the transfer gate. In an embodiment, a width of the doped region may be greater than the width of such a part of the transfer gate.

Figure 1:
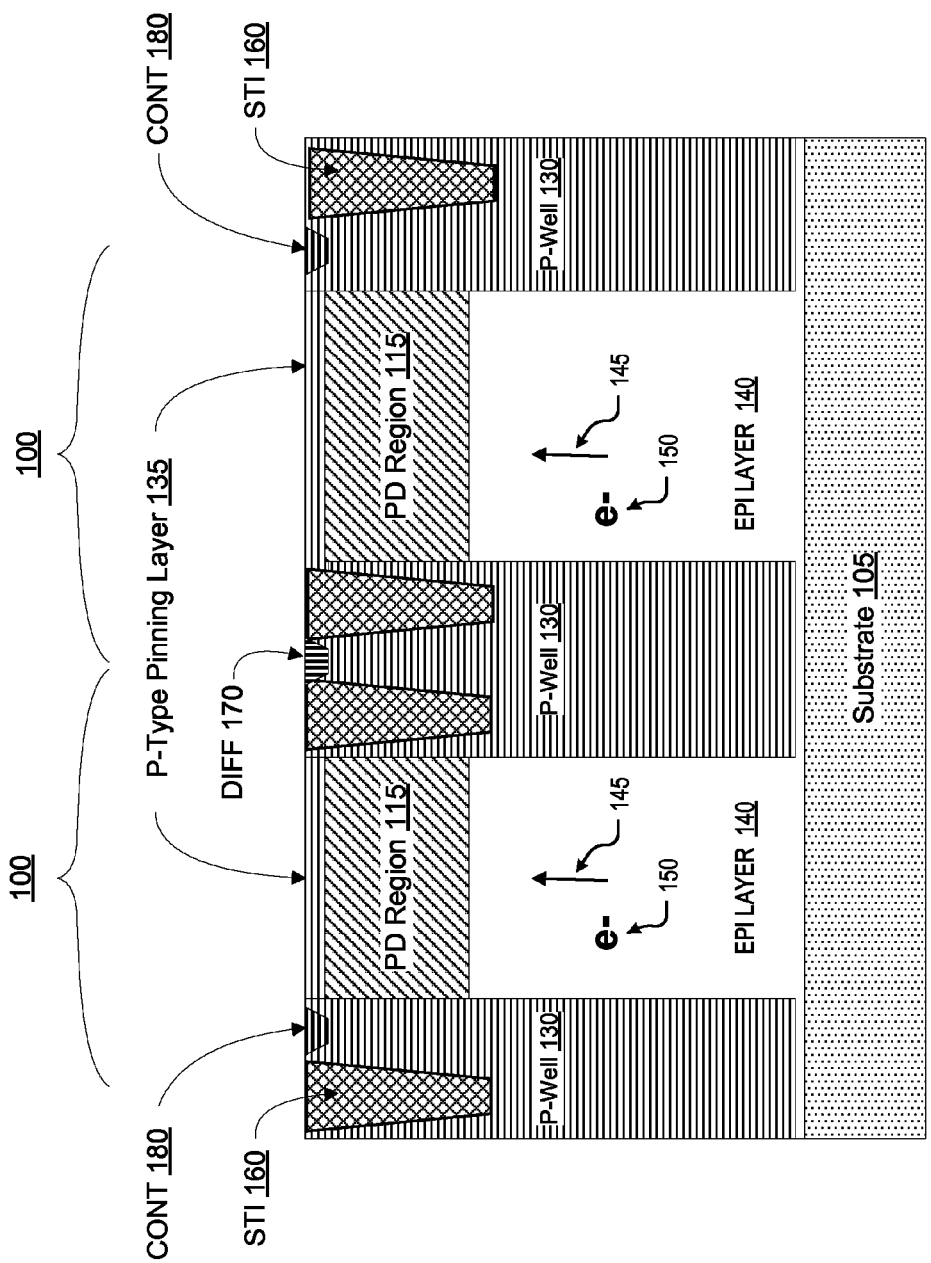
FIG. 1 is a cross-sectional view showing features of a pixel array according to an existing technique.
Figure 2:
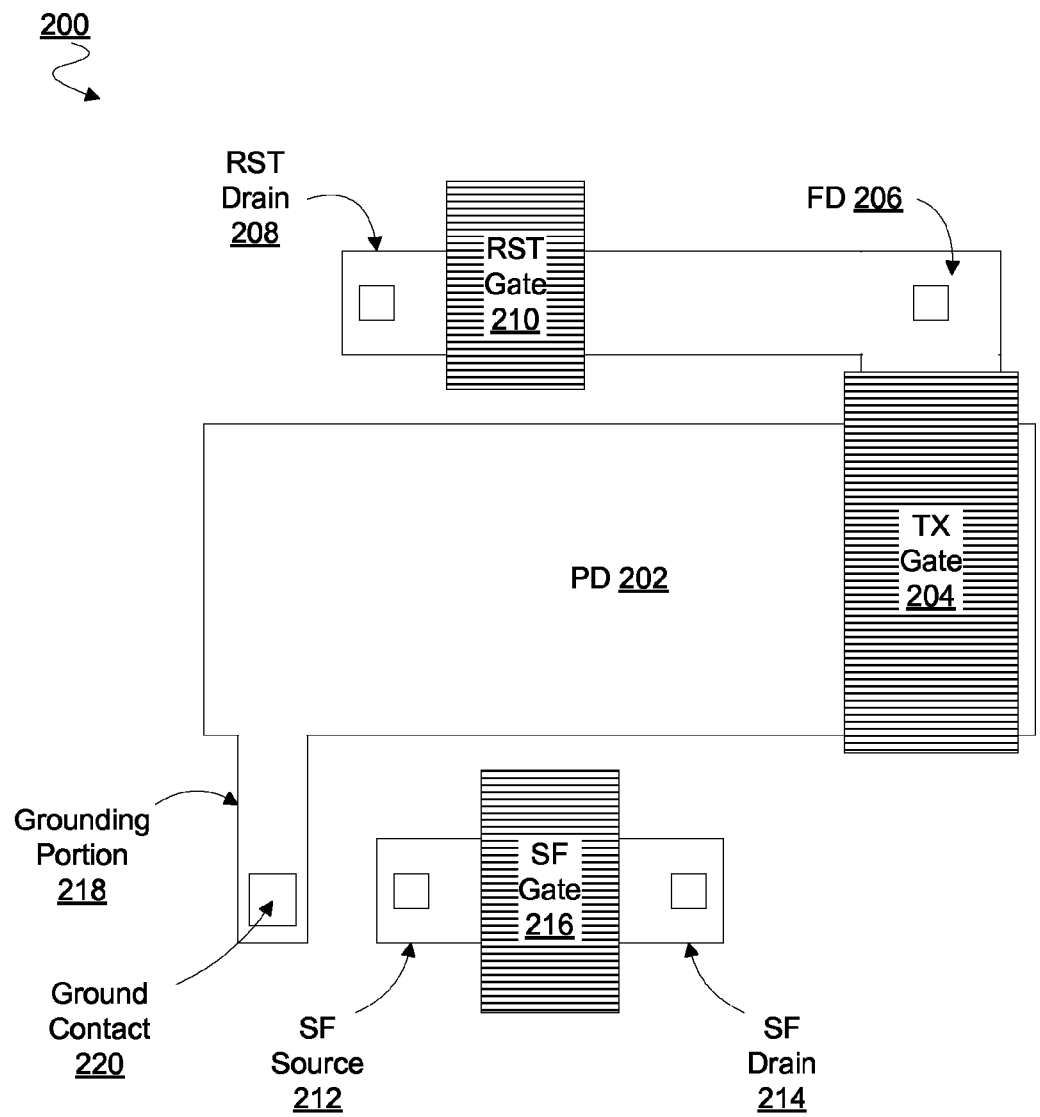
FIG. 2 is a surface elevation view showing features of a pixel array according to an existing technique.
Figure 3:
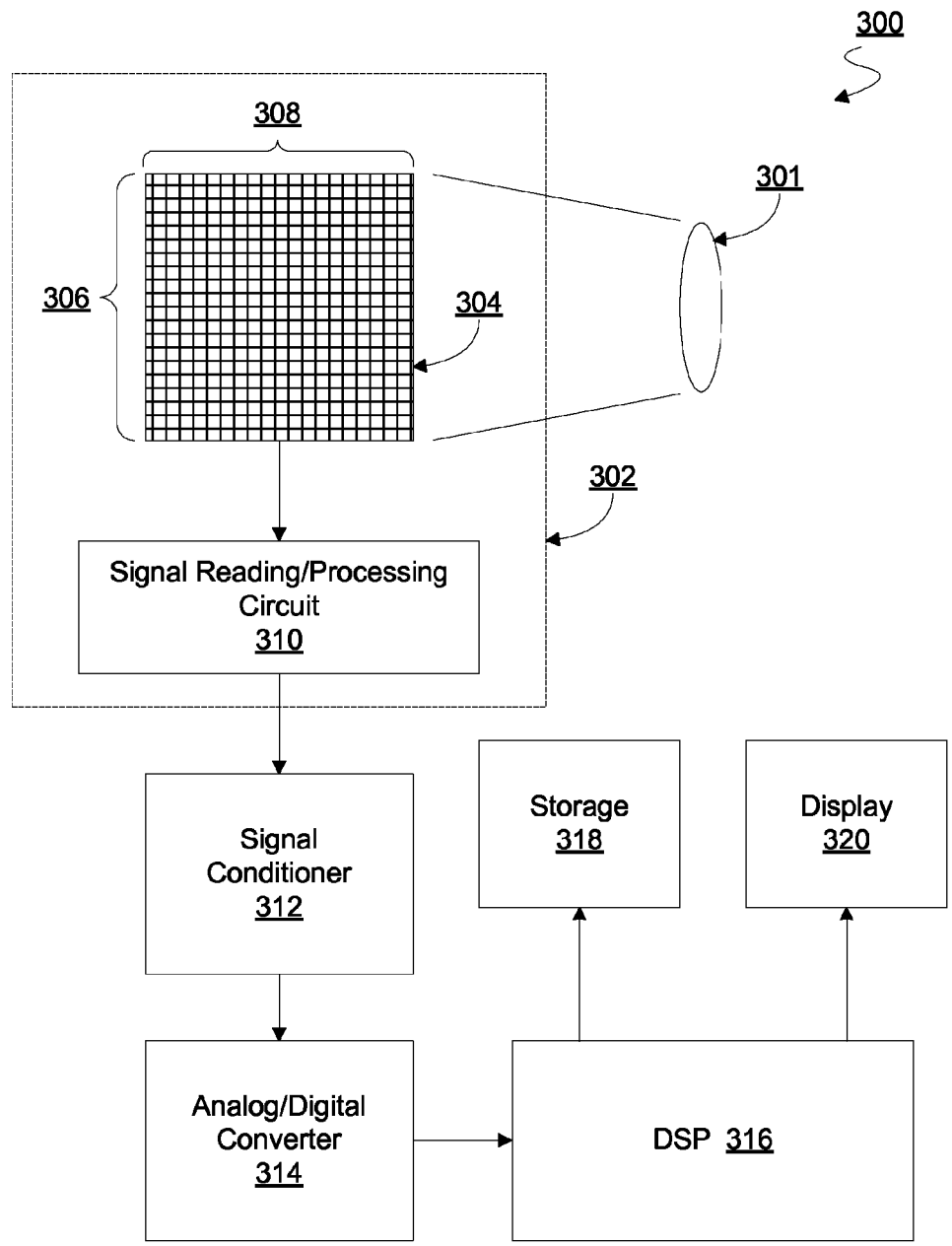
FIG. 3 is a block diagram illustrating features of an imaging system in accordance with one embodiment.

FIG. 3 illustrates an embodiment of an imaging system 300. Optics 301, which may include refractive, diffractive or reflective optics or combinations of these, may be coupled to image sensor 302 to focus an image onto the pixels in pixel array 304 of the image sensor. Pixel array 304 may capture the image and the remainder of apparatus 300 may process the pixel data from the image.

Image sensor 302 may comprise a pixel array 304 and a signal reading and processing circuit 310. Pixel array 304 may be a two-dimensional array including plurality of pixels arranged in rows 306 and columns 308. During operation of pixel array 304 to capture an image, one or more pixels in pixel array 304 may capture incident light (i.e., photons) during a certain exposure period and convert the collected photons into an electrical charge. The electrical charge generated by one or more pixels may be read out as an analog signal, and a characteristic of the analog signal (such as its charge, voltage or current) may be representative of the intensity of light that was incident on the pixel during the exposure period. In an embodiment, some or all pixels of pixel array 304 may be variously include respective structures which provide ground contacts for improved conductivity in pixel array 304.

Illustrated pixel array 304 is regularly shaped, but in other embodiments pixel array 304 may have a regular or irregular arrangement different than shown and may include more or less pixels, rows, and columns than shown. Moreover, in different embodiments pixel array 304 may be a color image sensor including red, green, and blue pixels to capture images in the visible portion of the spectrum, or may be a black-and-white image sensor and/or an image sensor to capture images in an invisible portion of the spectrum, such as infra-red or ultraviolet.

Image sensor 302 may include signal reading and processing circuit 310. Among other things, circuit 310 may include circuitry and logic that methodically read analog signals from one or more pixels and filter these signals, correct for defective pixels, and so forth. Although shown in the drawing as an element separate from pixel array 304, in some embodiments reading and processing circuit 310 may be integrated with pixel array 304 on the same substrate or may comprise circuitry and logic embedded within the pixel array. In other embodiments, however, reading and processing circuit 310 may be an element external to pixel array 304 as shown in the drawing. In still other embodiments, reading and processing circuit 310 may be an element not only external to pixel array 304, but also external to image sensor 302.

Signal conditioner 312 may be coupled to image sensor 302 to receive and condition analog signals from pixel array 304 and reading and processing circuit 310. In different embodiments, signal conditioner 312 may include various components for conditioning analog signals. Examples of components that may be found in signal conditioner 312 include filters, amplifiers, offset circuits, automatic gain control, etc. Analog-to-digital converter (ADC) 314 may be coupled to signal conditioner 312 to receive conditioned analog signals corresponding to one or more pixels in pixel array 304 from signal conditioner 312 and convert these analog signals into digital values.

Digital signal processor (DSP) 316 may be coupled to analog-to-digital converter 314 to receive digitized pixel data from ADC 314 and to process the digital data to produce a final digital image. DSP 316 may include a processor and an internal memory in which it may store and retrieve data. After the image is processed by DSP 316, it may be output to one or both of a storage unit 318 such as a flash memory or an optical or magnetic storage unit and a display unit 320 such as an LCD screen.

Figure 4:
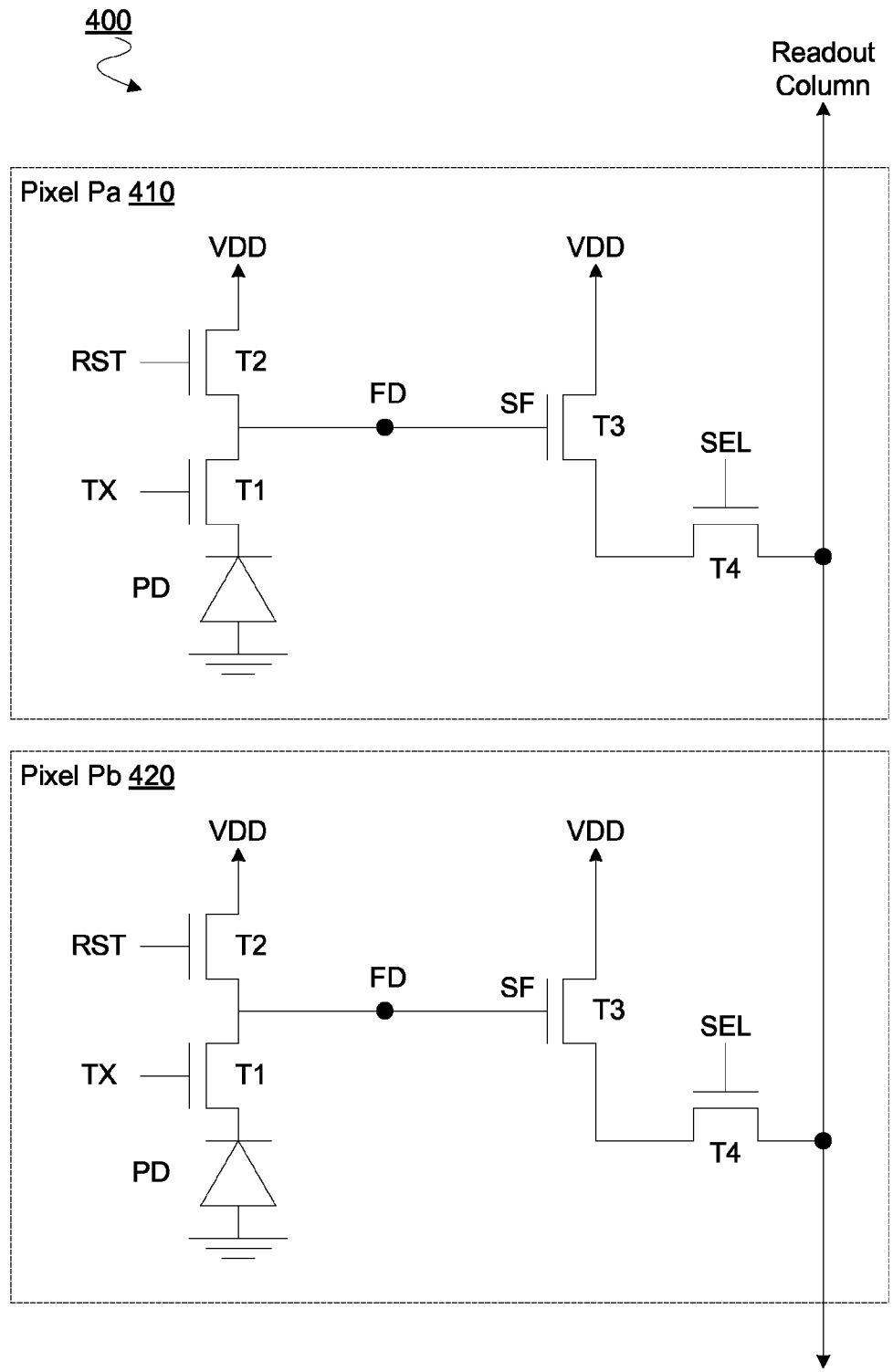
FIG. 4 is a circuit diagram illustrating features of 4T pixel circuitry in accordance with an embodiment.

FIG. 4 is a circuit diagram illustrating pixel circuitry 400 of two four-transistor ("4T") pixels within a pixel array, in accordance with one embodiment. Pixel circuitry 400 is illustrative of one possible pixel circuitry architecture for implementing pixels within an array such a pixel array 304. However, it should be appreciated that certain embodiments are not limited to 4T pixel architectures; rather, one of ordinary skill in the art having the benefit of the instant disclosure will understand that the present teachings are also applicable to 3T designs, 5T designs, and various other pixel architectures.

In FIG. 4, pixels Pa and Pb are arranged in two rows and one column. Pixels Pa and Pb may, for example, reside in a pixel array having some or all of the features of pixel array 300. In the illustrated embodiment of pixel circuitry 400, each of pixels Pa, Pb includes a photodiode PD, a transfer transistor T1, a reset transistor T2, a source-follower ("SF") transistor T3 and a select transistor T4. During operation, transfer transistor T1 may receive a transfer signal TX, which transfers the charge accumulated in photodiode PD to a floating diffusion node FD. In one embodiment, floating diffusion node FD may be coupled to a storage capacitor (not shown) for temporarily storing image charges. In an embodiment, the photodiodes PD of some or all pixels of pixel circuitry 400 are disposed in respective active areas which each include a ground contact for improved conductivity in pixel circuitry 400.

Reset transistor T2 may be coupled between a power rail VDD and the floating diffusion node FD to reset the pixel (e.g., discharge or charge the FD and the PD to a preset voltage) under control of a reset signal RST. The floating diffusion node FD may be coupled to control the gate of SF transistor T3. SF transistor T3 may be coupled between the power rail VDD and select transistor T4. SF transistor T3 may operate as a source-follower providing a high impedance connection to the floating diffusion FD. Finally, select transistor T4 may selectively couple the output of pixel circuitry 400 to the readout column line under control of a select signal SEL.

In one embodiment, the TX signal, the RST signal, and the SEL signal are generated by circuitry such as that having some or all of the features of signal reading and processing circuit 310. In an embodiment where pixel array 400 operates with a global shutter, the global shutter signal may be coupled to the gate of each transfer transistor T1 in the entire pixel array 400 to simultaneously commence charge transfer from each pixel's photodiode PD. Alternatively, rolling shutter signals may be applied to groups of transfer transistors T1.

FIGS. 5A through 5D show structures in various respective views 500, 505, 510, 515 of a pixel array in accordance with an embodiment. The pixel array shown in cross-sectional view 500 may include an epitaxial layer Epi 520 disposed on a semiconductor substrate 525. Epi 520 may have disposed therein an active area of a pixel cell, where the active area is defined at least in part by one or more isolation structures—e.g. including a STI—and/or by one or more doped well structures which surround or underlie such one or more isolation structures in Epi 520. By way of illustration and not limitation, functionality of such an active area may correspond to functionality of the area of a pixel cell 100 which is in epitaxial layer 140 and between adjoining p-wells 130 (and/or between adjoining STIs 160). In an embodiment, the pixel cell shown in view 500 includes some or all of the features of a pixel cell in pixel array 400.

In an embodiment, a first portion FP 530 of the active area includes a photodiode—e.g. represented by an illustrative PD region (PDR) 540 and pinning layer 550. Functionality of PDR 540 and pinning layer 550 may correspond, respectively, to that of PD region 115 and pinning layer 135, for example. The photodiode may be proximate to—e.g. adjoin—a side 560 of FP 530 which is defined at least in part by isolation and/or well structures adjoining FP 530 of the active area. The cross-section shown in view 500 does not include PDR 540, pinning layer 550 or side 560. However, to illustrate features of certain embodiments, features of PDR 540, pinning layer 550 and side 560 from a parallel cross-section are variously represented in view 500 with dashed lines to show their relative positions with respect to other features which actually are within the cross-section shown in view 500.

In an embodiment, the pixel cell shown in view 500 includes a Tx gate 570 of a transistor for transferring charge which accumulates in PDR 540. The transistor including Tx gate 570 may, for example, provide some or all of the functionality of transistor T1 in pixel cell Pa 410. Tx gate 570 may be disposed over the active area—e.g. where Tx gate 570 extends to—e.g. overlaps—side 560 of FP 530.

In an embodiment, a second portion SP 580 of the active area extends from side 560 of FP 530—e.g. where Tx gate 570 is adjacent to SP 580. To improve conductivity for the pixel cell shown in view 500, SP 580 may include a doped region GR 590 to provide a ground contact for the active area. Such grounding may, for example, be provided by coupling GR 590 to a ground trace (not shown) of a metal stack for the pixel array. The portion of Tx gate 570 overlapping side 560 may adjoin GR 590. Fabrication of the pixel cell in view 500 may include using Tx gate 570 as at least part of a mask for doping to form GR 590. GR 590 may thus be self-aligned with the portion of Tx gate 570 which overlaps side 560. In such an embodiment, masking with Tx gate 570 limits damage to FP 530 which might otherwise be caused by doping to form GR 590.

PDR 540 may, for example, be an n-type doped region, where substrate 525 and epitaxial layer 520 are p-type doped to respective degrees for operation with n-type doped PDR 540. In such an embodiment, pinning layer 550 and GR 590 are each p-type doped regions. However, it should be appreciated that the conductivity types of all such elements may, in certain embodiments, be swapped—for example, where substrate 525, epitaxial layer 510, pinning layer 550 and GR 590 are variously n-type doped and PDR 540 is p-type doped.

Figure 5B:
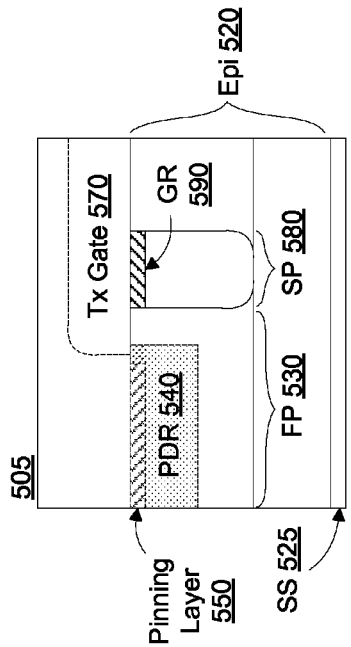
FIGS. 5A through 5D are elevation views illustrating features of a pixel array in accordance with an embodiment.
Figure 5A:
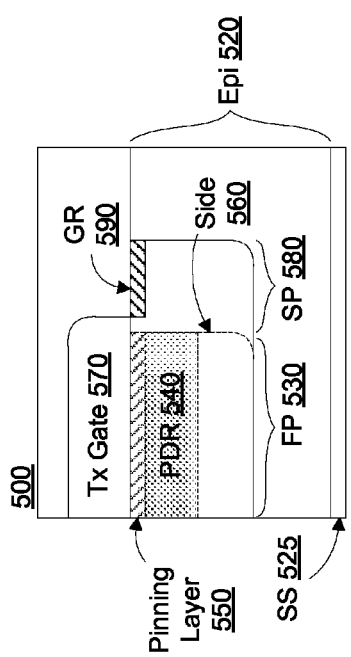

FIG. 5B provides another cross-sectional view 505 of the pixel array which is shown in view 500. View 505 shows an elevation which faces side 560 of FP 530. The cross-section shown in view 505 does not include PDR 540, pinning layer 550 or Tx gate 570. However, to illustrate features of certain embodiments, features of PDR 540, pinning layer 550 and Tx gate 570 from a parallel cross-section are variously represented in view 505 with dashed lines to show their relative positions with respect to other features which actually are within the cross-section shown in view 505.

As shown in view 505, photodiode structures in FP 530—e.g. PDR 540 and/or pinning layer 550—may be offset along side 560 from a location where SP 580 extends from side 560. Such a location may, for example, be overlapped by Tx gate 570. Such an offset of such photodiode structures from SP 580 and/or overlap of Tx gate 570 may reduce the possibility of photodiode defects resulting from doping to form GR 590.

Figure 5D:
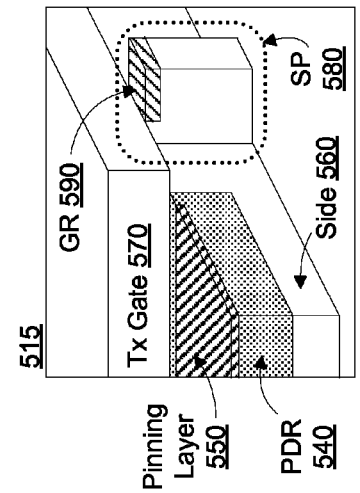
Figure 5C:
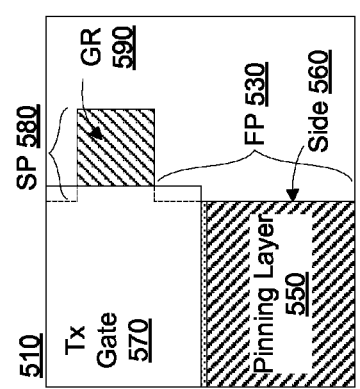

FIG. 5C provides another cross-sectional view 510 of the pixel array which is variously shown in views 500, 505. View 510 shows an elevation facing a top side of Tx gate 570, wherein features underneath Tx gate 570 are illustrated with dotted lines. View 510 shows photodiode structures in FP 530 which are offset along side 560 from a location where SP 580 extends from side 560. View 510 further shows SP 580 at least partially overlapped by Tx gate 570, where GR 590 of SP 580 is aligned with Tx gate 570.

FIG. 5D provides an orthographic view 515 of the pixel array which is variously shown in views 500, 505, 510. To avoid obscuring features of certain embodiments, isolation structures and/or other structures which adjoin the active area are not shown in view 515. Tx gate 570 may overlap at least part of SP 580, although certain embodiments are not limited in this regard. Additionally or alternatively, GR 590 and PDR 540 may adjoin different respective sides of Tx gate 570.

Figure 6A:
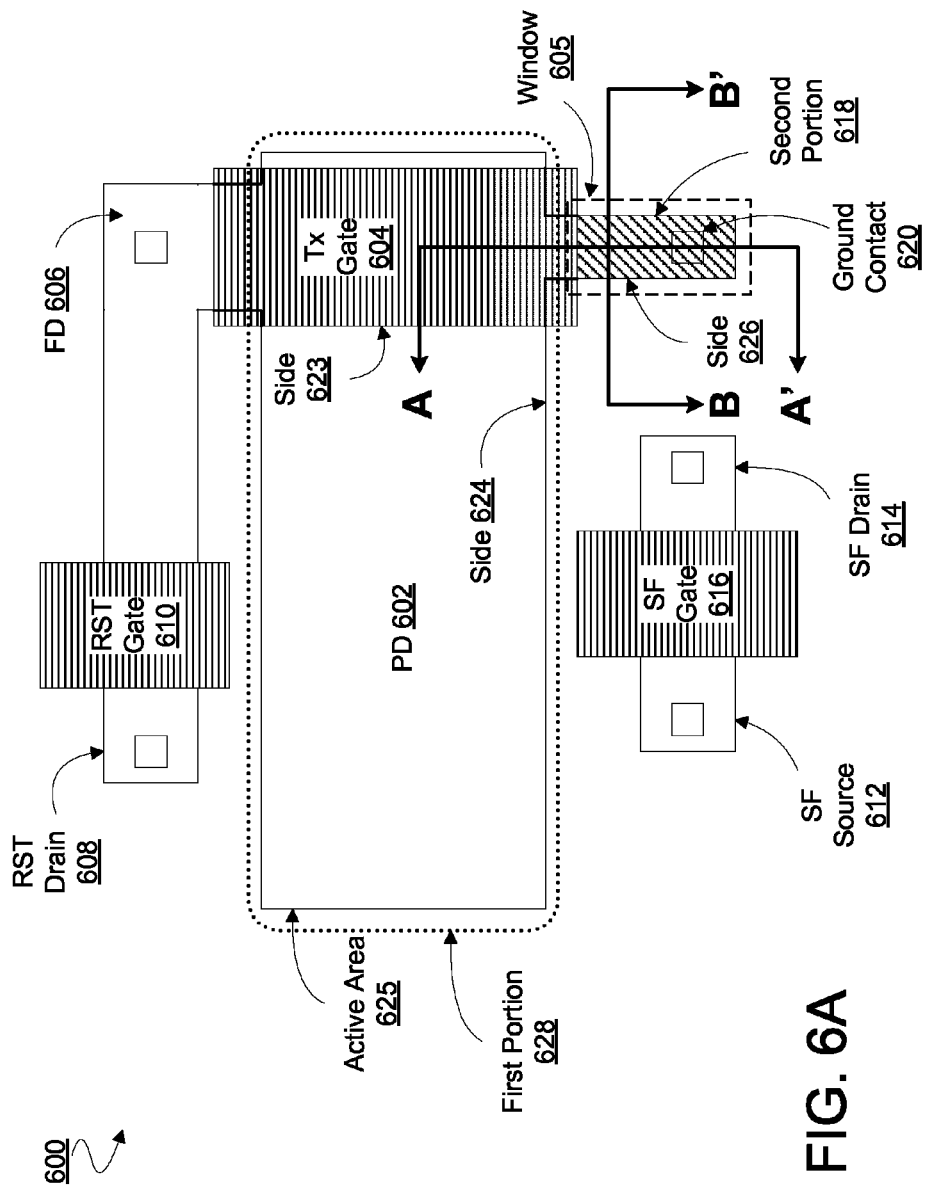
FIG. 6A is a surface elevation view illustrating features of a pixel cell according to an embodiment.

FIG. 6A shows elements of a pixel cell 600 for which grounding is provided at least in part by a second portion 618 of an active area 625 according to an embodiment. To contrast certain features of various embodiments from previous techniques, some elements of pixel cell 600 are shown as having a layout similar to that of pixel cell 200. However, any of a variety of alternative pixel cell layouts may be adapted to include improved grounding structures according to different embodiments.

Pixel cell 600 may include photodiode PD 602, a floating diffusion node 606, a transfer transistor comprising Tx gate 604, a reset transistor comprising RST drain 608 and RST gate 610, and a source-follower transistor comprising SF source 612, SF gate 616 and SF drain 614. Functionality of PD 602, the transfer transistor, reset transistor and source-follower transistor of pixel cell 600 may correspond, respectively, to that of PD, transistor T1, transistor T2 and transistor T3 of pixel Pa 410.

In an embodiment, active area 625, disposed in an epitaxial layer, is defined by one or more isolation structures and/or doped well structures which, at least at a surface of the epitaxial layer, surround or otherwise adjoin active area 625. By way of illustration and not limitation, the source follower transistor of pixel cell 600 may include an active area which is isolated from active area 625 by such one or more isolation structures and/or doped well structures.

PD 602 may be disposed in a first portion 628 of active area 625—e.g. where PD 602 is comprised of a PD region under a pinning layer (not shown). Tx gate 604 may be disposed on a surface of active area 625—e.g. where Tx gate 604 extends over first portion 628. To illustrate features of certain embodiments, various illustrative structural features of active area 625 which underlie Tx gate 604 are shown as partially visible through Tx gate 604. In an embodiment, Tx gate 604 is adjacent to (e.g. overlaps) a side 624 of first portion 628.

Alternatively or in addition, a side 623 of Tx gate 604 may overlap part of PD 602. First portion 628 may further include one or more other structures—e.g. including FD 606 and/or the reset transistor—although certain embodiments are not limited in this regard.

In an embodiment, a second portion 618 of active area 625 may extend from side 624—e.g. where side 624 and a nearest side 626 of second portion 618 form a corner portion overlapped by Tx gate 604. Tx gate 604 may be adjacent to second portion 618—e.g. where Tx gate 604 at least partially overlaps second portion 618 at the surface of the epitaxial layer. In an embodiment, at least some of second portion 618—e.g. an area of second portion 618 which is not overlapped by Tx gate 604—is doped to facilitate grounding of active area 625. For example, P+ doping of such an area of second portion 618 may allow a ground contact 620 to be used for coupling active area 625 to a metal trace or other conductor providing a reference potential.

In an illustrative embodiment, pixel cell 600 includes some or all of the structures shown in FIGS. 5A through 5D—e.g. where a cross-section A-A' of pixel cell 600 corresponds to the cross-section of view 500 and/or where a cross-section B-B' of pixel cell 600 corresponds to the cross-section of view 505. By way of illustration and not limitation, the functionality of Tx gate 604, first portion 628, second portion 618 and ground contact 620 may correspond, respectively, to the functionality of Tx gate 570, FP 530, SP 580 and GR 590. In an embodiment, second portion 618 is dedicated to providing ground contact 620 for active area 625—e.g. where second portion 618 does not further include any structure of a transistor or other circuit element. For example, dopant may cover all of the surface of second portion 618 which is not overlapped by Tx gate 604, in an embodiment.

The layout of second portion 618, side 624 and Tx gate 604 with respect to one another may provide at least in part for improved pixel cell fabrication, as compared to fabrication previous pixel cell layouts. By way of illustration and not limitation, fabrication of pixel cell 600 may include the positioning of a mask window 605 which defines an implantation region for doping the surface of second portion 618. Embodiments variously provide for Tx gate 604 to reduce the effects of error in positioning mask window 605. For example, the proximity of Tx gate 604 to second portion 618 may allow Tx gate 604 to limit doping for second portion 618 from extending into first portion 628. In an embodiment, the doped region of second portion 618 is self-aligned with Tx gate 604 as a result. By contrast, error in the positioning of an implant mask for grounding portion 218, for example, exposes PD 202 to the risk of defects in its depletion area.

Figure 6B:
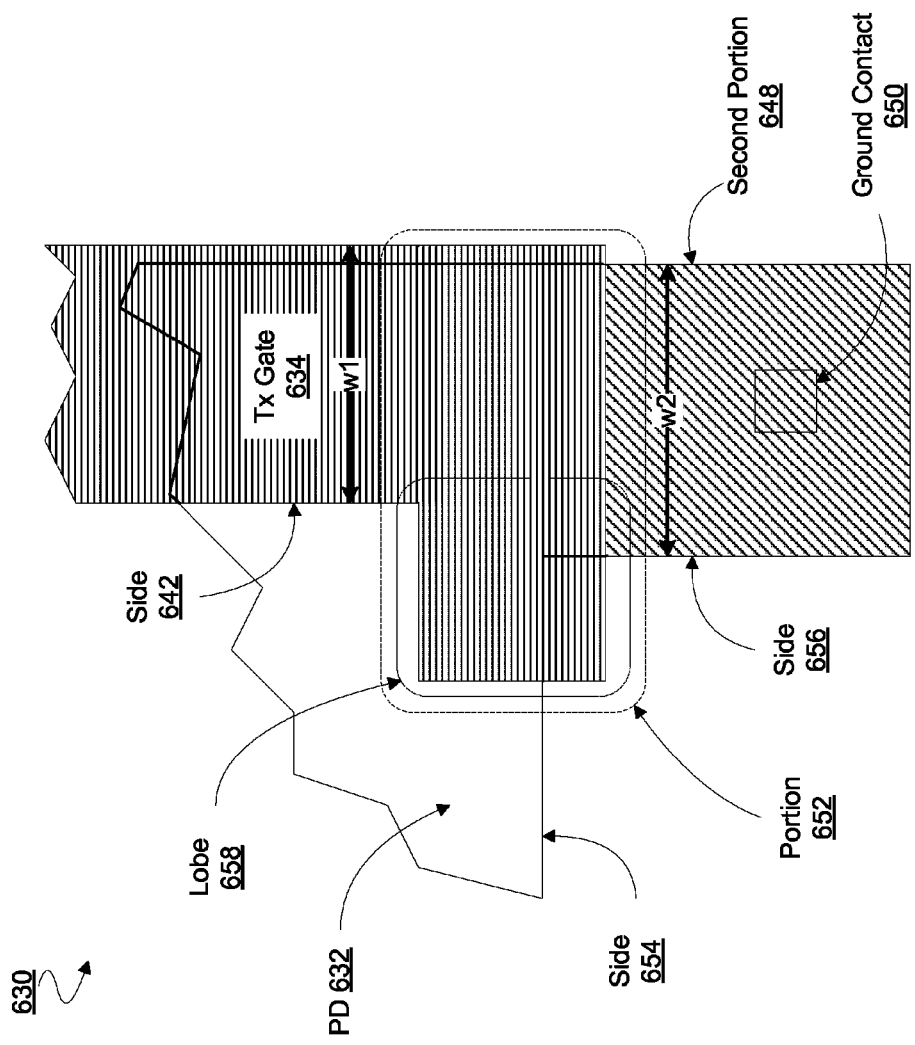
FIG. 6B is a surface elevation view illustrating features of a pixel cell according to an embodiment.

FIG. 6B shows elements of a pixel cell 630 including a structure to provide grounding according to an embodiment. Pixel cell 630 may include some or all of the features of pixel cell 600, for example. In an embodiment, pixel cell 630 includes a photodiode PD 632 in a first portion of an active area disposed in an epitaxial layer. Pixel cell 630 may further include a transfer transistor comprising Tx gate 634 disposed over a surface of the epitaxial layer. Functionality of PD 632 and Tx gate 634 may, for example, correspond to that of PD 602 and Tx gate 604, respectively.

Tx gate 634 may extend over the first portion of the active area which includes PD 632—e.g. where a portion 652 of Tx gate 634 extends to (e.g. over) side 654 of the active area. In an embodiment, a side 642 of Tx gate 634 adjoins PD 632—e.g. where Tx gate 634 overlaps part of PD 632. To illustrate features of certain embodiments, various features of the first portion of the active area—i.e. features which underlie Tx gate 634—are shown as partially visible through Tx gate 634. However, not all such underlying features are those of PD 632, in certain embodiments.

In an embodiment, a second portion 648 of the active area may extend from side 654—e.g. where side 654 and a nearest side 656 of second portion 648 form a corner portion overlapped by Tx gate 634. Tx gate 634 may be adjacent to second portion 648—e.g. where Tx gate 634 at least partially overlaps second portion 648 at the surface of the epitaxial layer. At least some of second portion 648—e.g. a surface of second portion 648 which is not overlapped by Tx gate 634—may be doped to facilitate grounding of the active area. For example, P+ doping of such an area of second portion 648 may allow a ground contact 650 to be used for coupling the active area to a metal trace or other conductor providing a reference potential.

In an illustrative embodiment, the functionality of Tx gate 634, the first portion of the active area (which includes PD 632 and side 654), second portion 648 and ground contact 650 may correspond, respectively, to the functionality of Tx gate 570, FP 530, SP 580 and GR 590. In an embodiment, second portion 648 is dedicated to providing ground contact 650 for the active area—e.g. where second portion 648 does not further include any structure of a transistor or other circuit element.

The layout of second portion 648, side 654 and Tx gate 634 with respect to one another may provide at least in part for improved pixel cell fabrication, as compared to fabrication previous pixel cell layouts. By way of illustration and not limitation, portion 652 of Tx gate 634 may include a lobe 658 extending from side 642 of Tx gate 634 in a first direction along side 654. Lobe 658 may provide for protection of structures of PD 632 during implant operations to dope second portion 648 for ground contact 650. For example, a L-shape structure of Tx gate 634 which includes lobe 658 may provide an implant mask to stop implantation of p+ (or other) ions from hitting structures of PD 632 which might otherwise create defects that are a source of dark current problems. Additionally or alternatively, lobe 658 may provide for such protection in conjunction with providing a comparatively narrow region of Tx gate 634—e.g. the region having a width w1 as measured from side 642 along a dimension which parallels side 654. Such narrowing of Tx gate 634 may allow for a larger area of pixel cell 630 to be occupied by structures of PD 632. In an embodiment, the width w1 of such a region of Tx gate 634 may be smaller than a width w2 of second portion 648 (as measured along the same dimension).

Figure 6C:
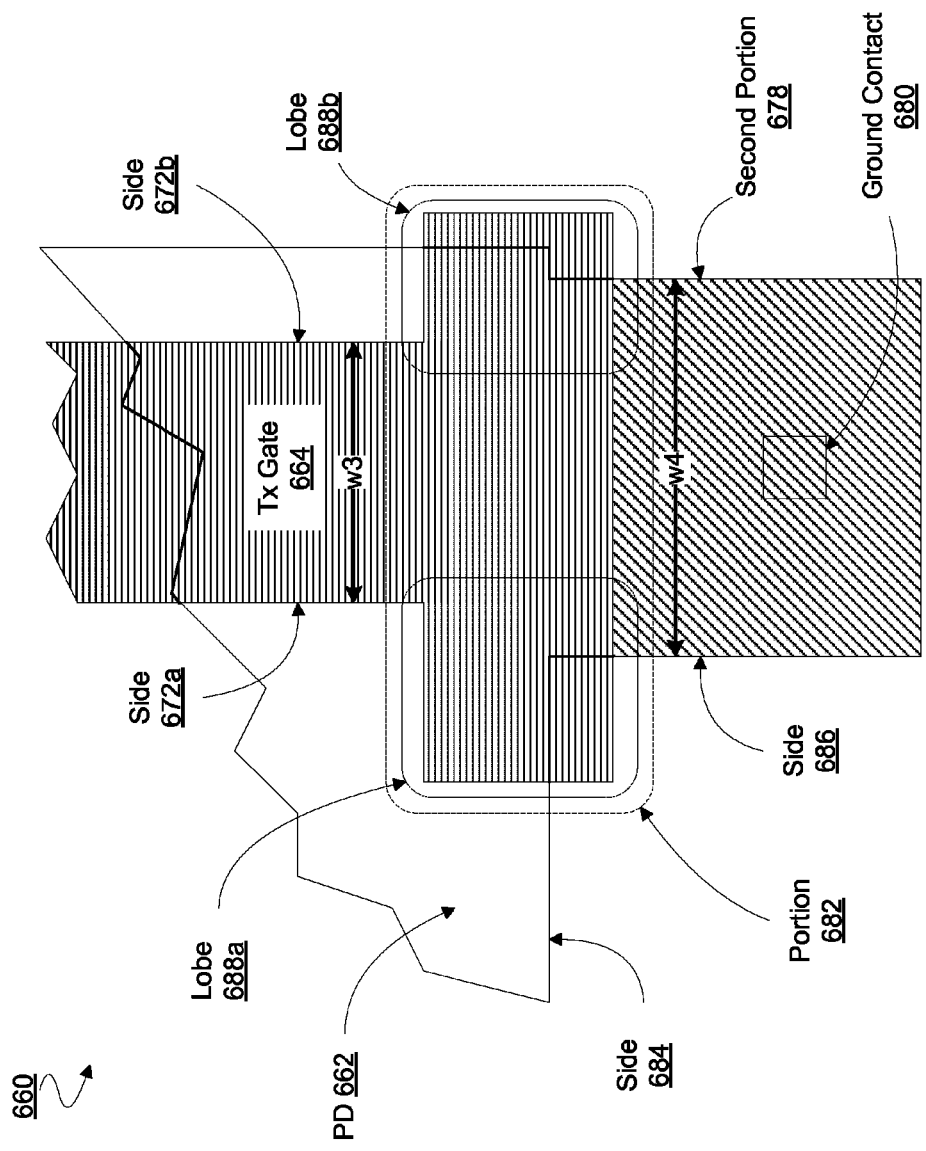
FIG. 6C is a surface elevation view illustrating features of a pixel cell according to an embodiment.

FIG. 6C shows elements of a pixel cell 660 including a structure to provide grounding according to an embodiment. Pixel cell 660 may include some or all of the features of pixel cell 600, for example. In an embodiment, pixel cell 660 includes a photodiode PD 662 in a first portion of an active area disposed in an epitaxial layer. Pixel cell 660 may further include a transfer transistor comprising Tx gate 664 disposed over a surface of the epitaxial layer. Functionality of PD 662 and Tx gate 664 may, for example, correspond to that of PD 602 and Tx gate 604, respectively.

Tx gate 664 may extend over the first portion of the active area which includes PD 662—e.g. where a portion 682 of Tx gate 664 extends to (e.g. over) side 684 of the active area. In an embodiment, a side 672a of Tx gate 664 adjoins PD 662—e.g. where Tx gate 664 overlaps part of PD 662. To illustrate features of certain embodiments, various features of the first portion of the active area—i.e. features which underlie Tx gate 664—are shown as partially visible through Tx gate 664. However, not all such underlying features are those of PD 662, in certain embodiments.

In an embodiment, a second portion 678 of the active area may extend from side 684—e.g. where side 684 and a nearest side 686 of second portion 678 form a corner region overlapped by Tx gate 664. Tx gate 664 may be adjacent to second portion 678—e.g. where Tx gate 664 at least partially overlaps second portion 678 at the surface of the epitaxial layer. At least some of second portion 678—e.g. a surface of second portion 678 which is not overlapped by Tx gate 664—may be doped to facilitate grounding of the active area. For example, P+ doping of such an area of second portion 678 may allow a ground contact 680 to be used for coupling the active area to a metal trace or other conductor providing a reference potential.

In an illustrative embodiment, the functionality of Tx gate 664, the first portion of the active area (which includes PD 662 and side 684), second portion 678 and ground contact 680 may correspond, respectively, to the functionality of Tx gate 570, FP 530, SP 580 and GR 590. In an embodiment, second portion 678 is dedicated to providing ground contact 680 for the active area—e.g. where second portion 678 does not further include any structure of a transistor or other circuit element.

The layout of second portion 678, side 684 and Tx gate 664 with respect to one another may provide at least in part for improved pixel cell fabrication, as compared to fabrication previous pixel cell layouts. By way of illustration and not limitation, portion 682 of Tx gate 664 may include a lobe 688a extending from side 672a of Tx gate 664 in a first direction along side 684. Portion 682 may further include a lobe 688b extending from side 672b of Tx gate 664 in an opposite direction along side 684. Lobes 688a, 688b may provide for protection of structures of PD 662 during operations to fabricate doped region 678. For example, a hammerhead structure of Tx gate 664 which includes lobes 688a, 688b may provide an implant mask to stop implantation of p+ (or other) ions from hitting structures of PD 662 which might otherwise create defects that are a source of dark current problems. Additionally or alternatively, lobes 688a, 688b may provide for such protection in conjunction with providing a comparatively narrow region of Tx gate 664—e.g. the region having a width w3 as measured between sides 672a, 672b of Tx gate 664 along a dimension which parallels side 684. Such narrowing of Tx gate 664 may allow for a larger area of pixel cell 660 to be occupied by structures of PD 662. In an embodiment, the width w3 of such a region of Tx gate 664 may be smaller than a width w4 of second portion 678 (as measured along the same dimension).

Figure 7:
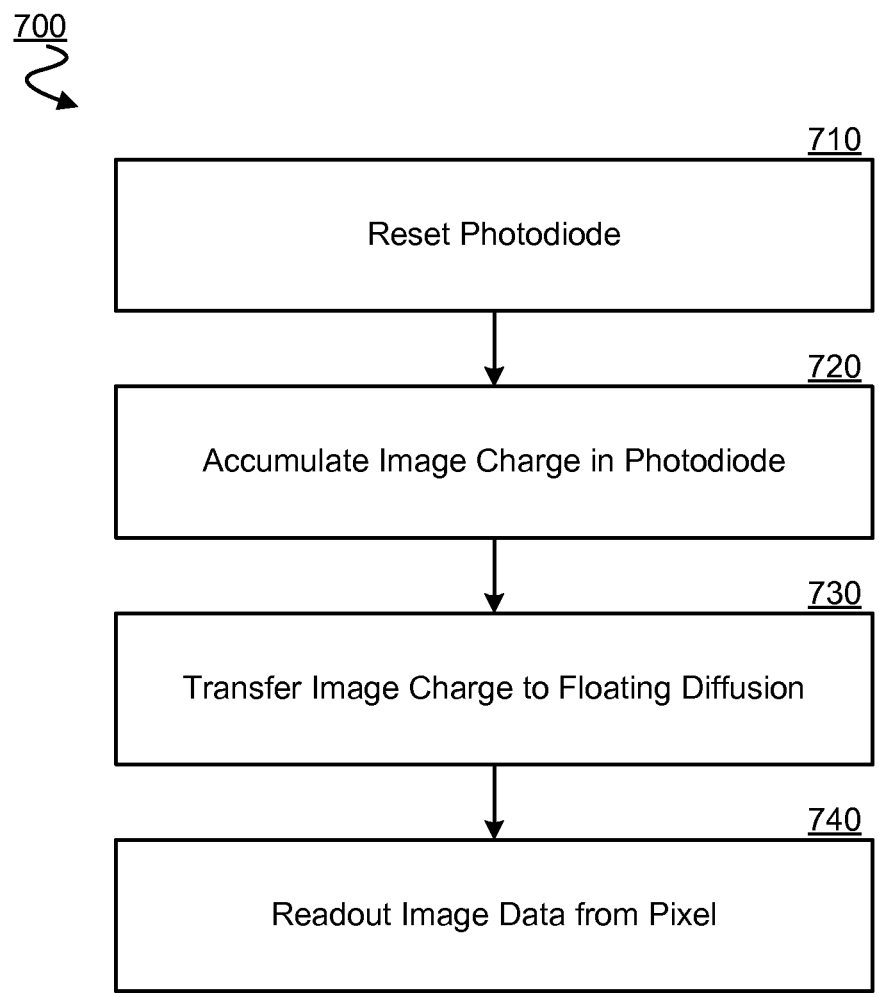
FIG. 7 is a flow chart illustrating features of a method for operating a pixel array according to an embodiment.

FIG. 7 is a flow chart illustrating a method 700 for operating a pixel cell in accordance with one embodiment. Method 700 may, for example, illustrate operation of a single pixel which is grounded with an adjoining doped region as shown in FIGS. 5A-5D. Method 700 may be sequentially or concurrently executed to variously operate one or more pixels—e.g. in circuitry such as that of pixel array 304 and/or pixel circuitry 400—depending upon whether a rolling shutter or global shutter is used. The order in which some or all of the operations appear in method 700 should not be deemed limiting. Rather, one of ordinary skill in the art having the benefit of the present disclosure will understand that some of the operations may be executed in a variety of orders not illustrated.

In a block 710, photodiode PD may be reset. Resetting may include discharging or charging photodiode PD to a predetermined voltage potential, such as VDD. The reset may be achieved by asserting both a RST signal to enable a reset transistor T2 and asserting a TX signal to enable a transfer transistor T1. Enabling T1 and T2 may couple photodiode region PD and floating diffusion FD of the pixel cell to a power rail VDD. The photodiode region PD may be disposed in first portion of an active area of an epitaxial layer. In an embodiment, the active area may further include a second portion which is doped to provide a ground contact, the second portion extending from a side of the first portion which is overlapped by a gate of transfer transistor T1.

Once reset, the RST signal and the TX signal may be de-asserted to commence image acquisition by a photodiode region (block 720). Light incident on the backside of an imaging pixel, for example, may cause charge to accumulate within photodiode PD.

Once the image acquisition window has expired, the accumulated charge within photodiode PD may be transferred via transfer transistor T1 to floating diffusion FD by asserting the TX signal (block 730). In the case of a global shutter, the global shutter signal may be asserted simultaneously, as the TX signal, to all pixels within the pixel array (e.g. pixel array 205) during block 730. This results in a global transfer of the image data accumulated by each pixel into the pixel's corresponding floating diffusion FD.

Once the image data is transferred, the TX signal may be de-asserted to isolate floating diffusion FD from photodiode PD for readout. In a block 740, the SEL signal may be asserted to transfer the stored image data onto the readout column for output—e.g. to the function logic 215 via readout circuitry 210. It should be appreciated that readout may occur on a per row basis via column lines (illustrated), on a per column basis via row lines (not illustrated), on a per pixel basis (not illustrated), or by other logical groupings. Once the image data of all pixels has been readout, method 700 may return to block 710 to prepare for the next image.

In one embodiment, other circuitry may include a storage capacitor coupled to the floating diffusion FD to temporarily store the image charge so that post image acquisition processing may be executed within each pixel prior to readout in block 740. Additionally or alternatively, such other circuitry may include gain circuitry, ADC circuitry, or otherwise.

Figure 8:
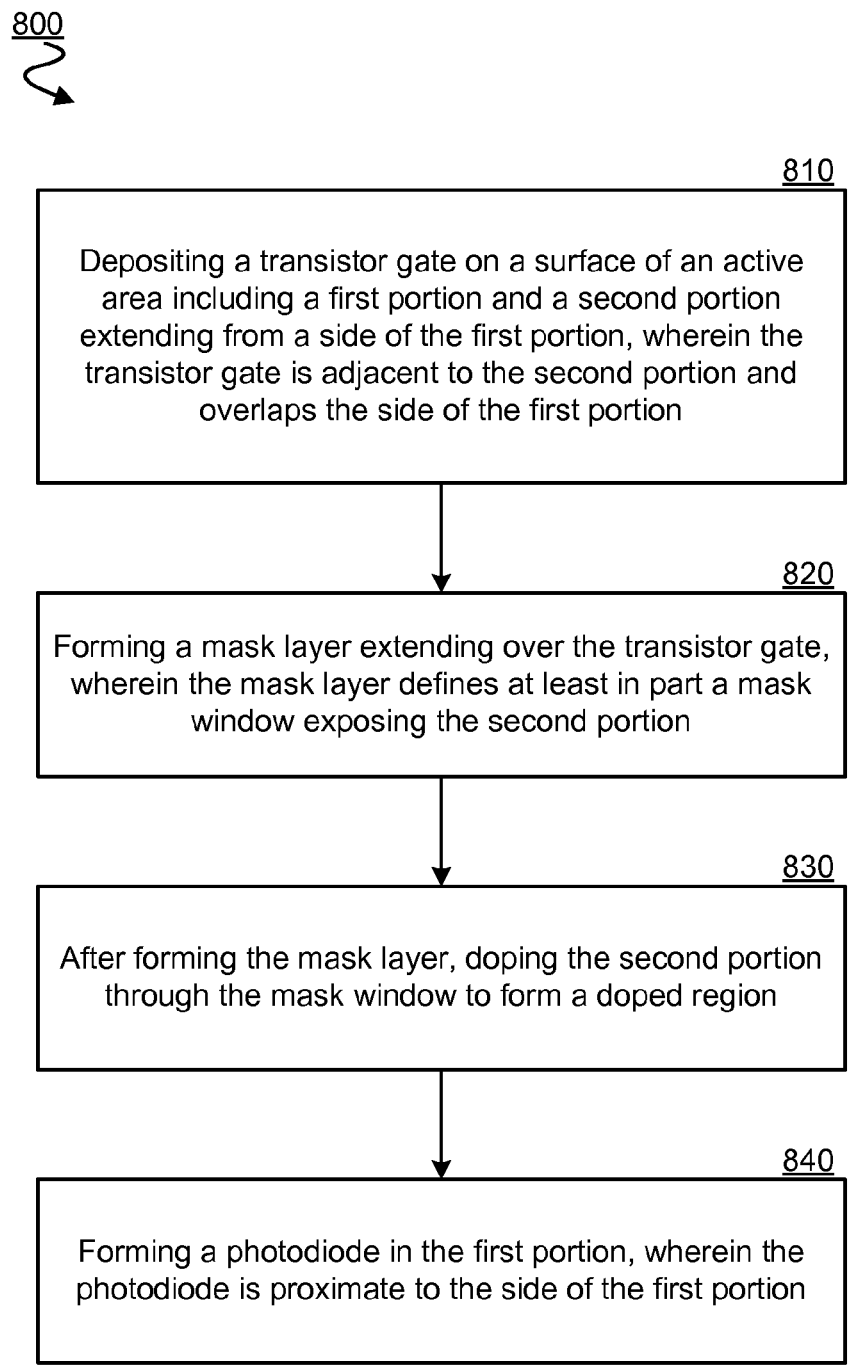
FIG. 8 is a flow chart illustrating features of a method for fabricating a pixel cell according to an embodiment.

FIG. 8 illustrates elements of a method 800 for fabricating a pixel cell according to an embodiment. Method 800 may fabricate a pixel cell having some or all of the features of the pixel cell shown in FIGS. 5A-5D, for example. By way of illustration and not limitation, method 800 may fabricate any of pixel cells 600, 630, 660.

Method 800 may include, at 810, depositing a transistor gate on a surface of an active area in an epitaxial layer. The active area may include a first portion comprising a side, and a second portion extending from the side of the first portion. By way of illustration and not limitation, the active area may include FP 530 and SP 560, where the depositing at 810 forms Tx gate 570. The transistor gate deposited at 810 may, for example, be adjacent to the second portion and overlap the side of the first portion. In an embodiment, the transistor gate at least partially overlaps the second portion.

In an embodiment, a portion of the transistor gate which is adjacent to the second portion and overlaps the side of the first portion may include a first lobe extending along the side of the first portion in a first direction. Such a portion of the transistor gate may further comprise a second lobe extending along the side of the first portion in an opposite direction. In an embodiment, such a lobe of the transistor gate extends from a first side of the transistor gate, wherein the transistor gate has a first width at the first side. The second portion of the active area may, for example, have a second width greater than such a first width.

Method 800 may further include, at 820, forming a mask layer extending over the transistor gate, wherein the mask layer defines at least in part a mask window exposing the second portion. The mask window may, for example, have some or all of the features of window 605, although certain embodiments are not limited in this regard.

After the mask layer has been formed, method 800 may include, at 830, doping the second portion through the mask window. The doping at 830 may form a doped region to provide a ground contact for the active area—e.g. where the doped region includes some or all of the features of doped region GR 590. In an embodiment, the doping at 830 provides for any of ground contacts 620, 650, 680.

Method 800 may further include, at 840, forming a photodiode in the first portion, wherein the photodiode is proximate to the side of the first portion. The forming of the photodiode at 840 may, for example, include performing an implant of a doped region such as PDR 540. The forming at 840 may be performed after the depositing at 810 and/or after the doping at 830, although certain embodiments are not limited in this regard. The forming of the photodiode at 840 may be performed, for example, after depositing of the transistor gate at 810. The forming of the photodiode at 840 may be performed prior to the forming of the mask layer at 820, although certain embodiments are not limited in this regard.

FIGS. 9A through 9F show respective views 900, 905, 910, 915, 920, 925 for various phases of a process for fabrication of a pixel cell according to an embodiment. Views 900, 905, 910, 915, 920, 925 may represent different phases of fabrication according to method 700, for example.

FIGS. 9A, 9C, 9E are each for a cross-section similar to that shown in view 500, for example. FIGS. 9B, 9D, 9F are each for a cross-section similar to that shown in view 510, for example. FIGS. 9A and 9B are different views of a first phase of pixel cell fabrication, FIGS. 9C and 9C are different views of a second phase of pixel cell fabrication, and FIGS. 9E and 9F are different views of a third phase of pixel cell fabrication.

View 900 shows an epitaxial layer Epi 935 for a pixel array—e.g. where Epi 935 is disposed on a semiconductor substrate (not shown). Epi 935 may have disposed therein an active area for a pixel cell of the pixel array, where the active area is defined at least in part by one or more isolation structures in Epi 935 and/or by one or more doped well structures which surround or underlie such one or more isolation structures.

As shown in views 900, 905, the active area may include a first portion FP 930 and a second portion SP 980 which extends from a side 960 of FP 930. FP 930, SP 980 and side 960 may correspond, for example, to FP 530, SP 580 and side 560. The cross-section shown in view 900 does not include side 960. However, to illustrate features of certain embodiments, features of side 960 from a parallel cross-section are represented in view 900 with dashed lines to show their relation to other features which actually are within the cross-section shown in view 900.

At the phase of fabrication variously shown in views 900, 905, a photodiode may be formed in FP 930—e.g. where the photodiode includes some or all of the features of PDR 540 under pinning layer 550. Such a photodiode may, for example, be proximate to—e.g. adjoin—side 960. However, such a photodiode may alternatively be formed in some later fabrication phase—e.g. after the fabrication phase shown in variously shown in views 910, 915 or after the fabrication phase shown in variously shown in views 920, 925. To avoid obscuring features of various embodiments, features of such a photodiode are not shown in FIGS. 9A through 9F.

At the phase of pixel cell fabrication variously shown in views 910, 915, a transfer gate 970 of a transistor may be deposited on a surface of Epi 935. The transistor may, for example, be to transfer charge accumulated in the photodiode of FP 930. The transistor including Tx gate 970 may, for example, provide some or all of the functionality of transistor T1 in pixel cell Pa 410. Tx gate 970 may extend to side 960 of FP 930—e.g. where the pixel cell includes an overlap 940 of side 960 by Tx gate 970. Additionally or alternatively, Tx gate 970 may be adjacent to second portion 980—e.g. where the pixel cell includes an overlap 945 of second portion 980 by Tx gate 970.

The illustrative Tx gate 970 includes a hammerhead portion comprising lobes which extend from respective sides of Tx gate 970 and which overlap side 960. The lobes may each extend in different respective directions along side 960. In another embodiment, the portion of Tx gate 970 overlapping side 960 may instead have a L-shape portion comprising only one lobe extending along side 960. In still another embodiment, the portion of Tx gate 970 overlapping side 960 may have no such lobes. A width of SP 980, as measured along side 960, may be greater than a parallel width of Tx gate 970 as measured at a portion which does not include such a lobe (or lobes).

At the phase of pixel cell fabrication variously shown in views 920, 925, a mask layer 950 may be deposited over one or more structures of the pixel cell. Mask layer 950 may extend at least over some or all of Tx gate 970, for example. In an embodiment, mask layer 950 includes one or more patterned structures. For example, mask layer 950 may define at least in part a mask window 955 which exposes some or all of second portion 980. After mask layer 950 is deposited, a doping 965—e.g. an implantation—may be performed through mask window 955 onto at least some of SP 980—e.g. wherein doping 965 dopes some or all of a surface of SP 980 which is not overlapped by Tx gate 970. A portion of Tx gate 970 which adjoins—e.g. overlaps—side 960 may limit dopant of doping 965 from entering into FP 930. For example, Tx gate 970 may serve as a mask structure which is available to limit any photodiode damage due to error in positioning mask window 955.

Techniques and architectures for providing an image sensor device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An image sensor device comprising:
   a pixel array comprising:
      a pixel cell including:
         an active area disposed in an epitaxial layer, wherein the epitaxial layer includes a single active area perimeter surrounding all of the active area, the active area comprising:
            a first portion including a side and a photodiode proximate to the side, the photodiode to accumulate a charge; and
            a second portion extending from the side, the second portion including a doped region to provide a ground contact for the active area; and
         a transistor to transfer the charge from the photodiode, the transistor comprising a gate disposed on a surface of the active area, wherein the gate abuts the second portion and overlaps the side; and
      readout circuitry coupled to read image data from the pixel array.

2. The image sensor device of claim 1, wherein the doped region is aligned with the gate.

3. The image sensor device of claim 1, wherein a portion of the gate is adjacent to the second portion and overlaps the side, the portion including a first lobe extending along the side in a first direction.

4. The image sensor device of claim 3, the portion of the gate further comprising a second lobe extending along the side in a second direction.

5. The image sensor device of claim 3, wherein the first lobe extends from a first side of the gate, wherein the gate has a first width at the first side, and wherein the second portion has a second width greater than the first width.

6. The image sensor device of claim 1, wherein the doped region comprises a p-type dopant.

7. The image sensor device of claim 1, wherein the gate at least partially overlaps the second portion.

8. A pixel array comprising:
   a pixel cell including:
      an active area disposed in an epitaxial layer, wherein the epitaxial layer includes a single active area perimeter surrounding all of the active area, the active area comprising:
         a first portion including a side and a photodiode proximate to the side, the photodiode to accumulate a charge; and
         a second portion extending from the side, the second portion including a doped region to provide a ground contact for the active area; and
      a transistor to transfer the charge from the photodiode, the transistor comprising a gate disposed on a surface of the active area, wherein the gate abuts the second portion and overlaps the side.

9. The pixel array of claim 8, wherein the doped region is aligned with the gate.

10. The pixel array of claim 8, wherein a portion of the gate is adjacent to the second portion and overlaps the side, the portion including a first lobe extending along the side in a first direction.

11. The pixel array of claim 10, the portion of the gate further comprising a second lobe extending along the side in a second direction.

12. The pixel array of claim 10, wherein the first lobe extends from a first side of the gate, wherein the gate has a first width at the first side, and wherein the second portion has a second width greater than the first width.

13. The pixel array of claim 8, wherein the doped region comprises a p-type dopant.

14. The pixel array of claim 8, wherein the gate at least partially overlaps the second portion.

* * * * *